United States Patent
Wu

(10) Patent No.: US 7,114,838 B2
(45) Date of Patent: *Oct. 3, 2006

(54) DISH LENS FOR BACKLIGHT MODULE AND LIGHT EMITTING DIODE

(75) Inventor: Meng-Chai Wu, Jhubei (TW)

(73) Assignee: AU Optronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/235,060

(22) Filed: Sep. 26, 2005

(65) Prior Publication Data

US 2006/0152932 A1  Jul. 13, 2006

(30) Foreign Application Priority Data

Jan. 12, 2005  (TW) .............................. 94100835 A

(51) Int. Cl.
*F21V 7/04* (2006.01)

(52) U.S. Cl. ...................... 362/607; 362/606; 362/609; 362/327; 359/707; 359/599

(58) Field of Classification Search ................ 362/603, 362/623, 327, 612, 498, 499, 256, 329, 335, 362/255; 359/707, 726, 727, 857, 856, 599
See application file for complete search history.

(56) References Cited

U.S. PATENT DOCUMENTS

| | | | | |
|---|---|---|---|---|
| 2,215,900 A | * | 9/1940 | Bitner | ......................... 362/309 |
| 2,254,962 A | * | 9/1941 | Harris et al. | ................. 362/327 |
| 5,894,196 A | * | 4/1999 | McDermott | .................. 313/512 |
| 6,679,621 B1 | | 1/2004 | West et al. | .................. 362/327 |
| 6,724,543 B1 | * | 4/2004 | Chinniah et al. | ............ 359/718 |
| 7,033,061 B1 | * | 4/2006 | Wu | ............................ 362/607 |
| 2004/0165273 A1 | * | 8/2004 | Kuo | ............................ 359/599 |

* cited by examiner

*Primary Examiner*—Renee Luebke
*Assistant Examiner*—Zahra I. Bennett
(74) *Attorney, Agent, or Firm*—Thomas, Kayden, Horstemeyer & Risley

(57) ABSTRACT

The backlight module includes a reflective sheet, at least one point light unit with a dish lens on the reflective sheet. The dish lens has a light-permeable surface formed on the bottom of the dish lens, a light-reflecting surface formed on top of the dish lens, two smooth curve surfaces formed on two side of the dish lens for connecting the light-reflecting surface and the light-permeable surface, and a light-scattering surface on the center of the light-reflecting surface. The profile of the light-permeable surface and the light-reflecting surface are a substantially concave shape. The profile of the light-scattering surface is a substantially convex shape. A light emitting diode (LED) device includes a light emitting semiconductor device and a dish lens encapsulating the light emitting semiconductor device. The dish lens allows the light beams emitted by the LED to diffuse more uniformly, resulting in a more uniform backlight emission.

15 Claims, 3 Drawing Sheets

DISH LENS FOR BACKLIGHT MODULE AND LIGHT EMITTING DIODE

BACKGROUND

The invention relates to a lens for a backlight module and a light emitting diode and, more particularly, to a dish lens for a direct type backlight module and a light emitting diode.

The arrangement of an LED for small backlight module of an LCD has recently been developed from side to an array arrangement suitable for a larger direct backlight module, which must blur the outline of the LED array to normalize the luminance of the LCD. Increasing the distance between the light source and the diffuser or the thickness and the haze of a diffuser can solve the above problem.

Referring to FIG. 1, a backlight module 1 comprises a diffuser 11, a reflective sheet 13, and a point light unit 14. The point light unit 14 is disposed between the diffuser 11 and the reflective sheet 13. The light emitted from the point light unit is reflected by the reflective sheet 13 and passes through the diffuser 11 to blur the outline of the point light unit 14.

Because the luminance between the point light unit 14 and reflective sheet 13 of the conventional backlight module 1 are different, the brightness of the display is not uniform. Although increasing the distance d between the point light unit 14 and the diffuser 11 solves the problem, the thickness of the backlight module increases the profile of the display.

Referring to FIG. 2, increasing a diffuser 11a also can solve the above problem. The diffuser 11a overlaps diffuser 11, increasing the thickness and the haze of the diffusers 11, 11a, blurring the outline of the tubes 14. The diffuser 11a not only increases costs but also the profile of the backlight module 1. As well, overlapping the diffusers 11, 11a decreases the utility rate of the light source. Increasing of point light units 14 results in increased costs.

FIG. 3 shows an embodiment disclosed in U.S. Pat. No. 6,679,621, SIDE EMITTING LED AND LENS, in which lens 15 comprises a funnel-shaped first element 151, and a second element 152 located under the lens 15. The first element 151 comprises a reflective surface 153 and a first light-refracting surface 154. The second element 152 comprises a curved second light-refracting surface 155 and a curved bottom surface 156. When an LED is put on point L, a first light beam 17 emitted from the LED passes through the bottom surface 156 to enter the lens 15 and is reflected by the reflective surface 153 through the first light-refracting surface 154, exiting the lens 15. A second light beam 18 emitted from an LED passes through the bottom surface 156 to the lens 15, and is refracted by the second element 152 to leave the lens 15. Light is reflected and refracted to increase luminance on sides of the lens 15. Because reflective sheet 16 is curved, thickness of the backlight module increases, while luminance is still not uniform.

SUMMARY

Embodiments of the present invention provide a dish lens for a backlight module and a light emitting diode. A backlight module comprises a reflective sheet, at least one point light unit, and at least one dish lens. The point light unit is located over the reflective sheet. The dish lens for wrapping the point light unit comprises a light-permeable surface, a light-reflecting surface, two smooth curve surfaces, and a light-scattering surface. The light-permeable surface is forming the bottom of the dish lens, the cross-section of the light-permeable surface is a substantially concave shape. The light-reflecting surface is forming the tope of the dish lens, the cross-section of the light-reflecting surface is a substantially concave shape. The two smooth curve surfaces form two sides of the dish lens for connecting the light-reflecting surface and the light-permeable surface at an inclined angle. The light-scattering surface is a substantially convex shape, located on the central axis of the light-reflecting surface.

The light emitting diode of the present invention comprises a light emitting semiconductor device and a dish lens. The light emitting semiconductor device is wrapped in the dish lens. Light from a light emitting semiconductor device is refracted and reflected by the dish lens to normalize luminance of a backlight module.

BRIEF DESCRIPTION OF THE DRAWINGS

Embodiments of the present invention can be more fully understood by reading the subsequent detailed description in conjunction with the examples and references made to the accompanying drawings, wherein.

DETAILED DESCRIPTION

Figure 1:
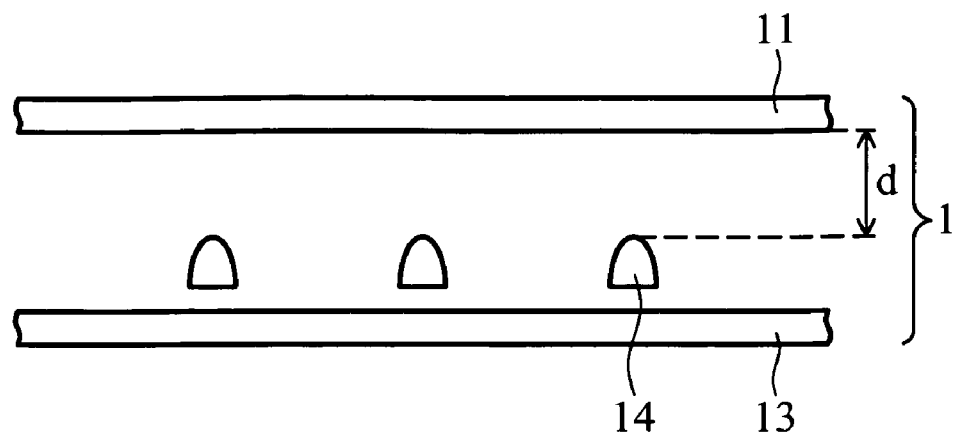
FIG. 1 is a schematic drawing of a conventional backlight module for a liquid crystal display.
Figure 2:
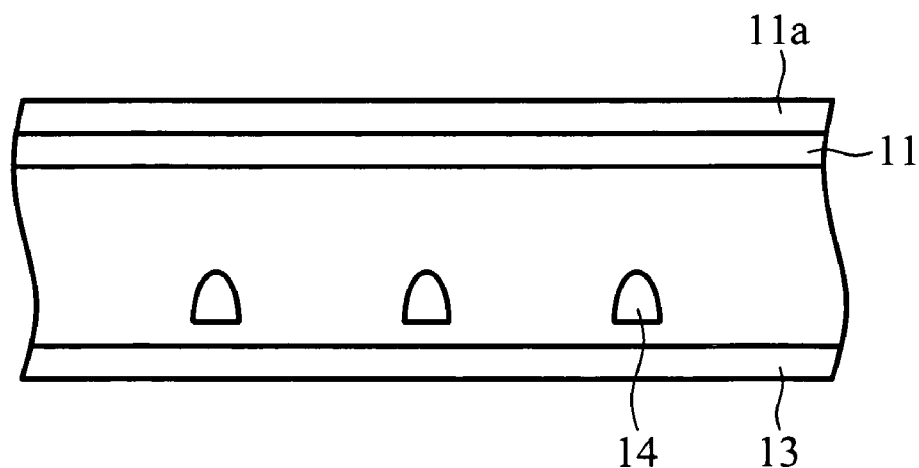
FIG. 2 is a schematic drawing of a conventional backlight module for a liquid crystal display.
Figure 3:
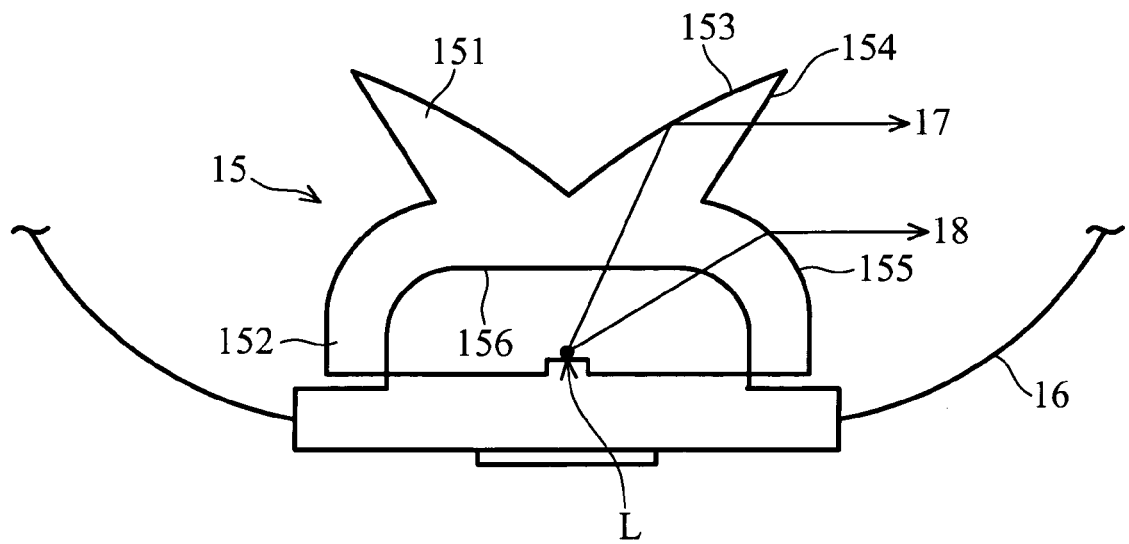
FIG. 3 is a schematic drawing of conventional light beams.
Figure 4:
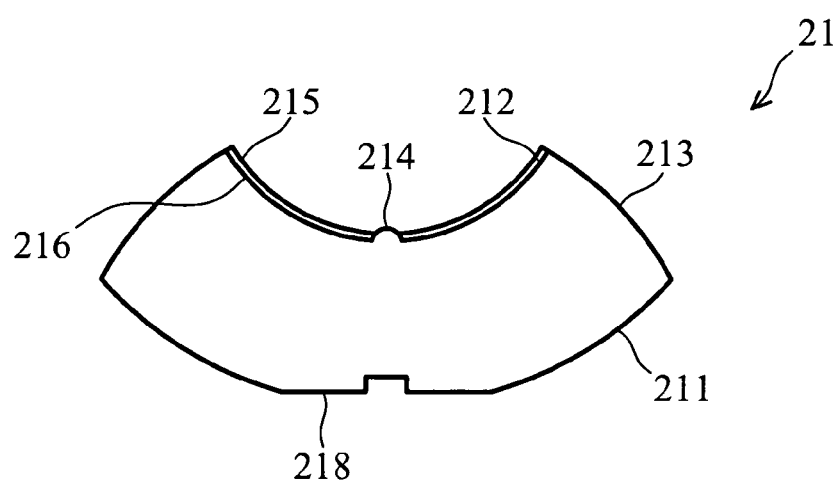
FIG. 4 is a schematic drawing of a dish lens and a point light unit of the present invention.

Referring to FIG. 4, a dish lens comprises a light-permeable surface 211, a light-reflecting surface 212, two smooth curve surfaces 213, and a light-scattering surface 214. The light-permeable surface 211 is forming the bottom of a dish lens 21 and is concave. The light-reflecting surface 212 is forming the tope of the dish lens 21, the cross-section of the light-reflecting surface is a substantially concave shape. The light-reflecting surface 212 forms a front reflective layer 215 and a back reflective layer 216. The smooth curve surfaces 213 are translucent and form two sides of the dish lens for connecting the light-reflecting surface 212 and the light-permeable surface 211 at an inclined angle. The light-scattering surface 214 is convex and located on the central axis of the light-reflecting surface 212. The light-permeable surface 212 comprises a space 217 and a plane 218. The space 217 is located in the center of the light-permeable surface 211 and receives point light unit 30.

Figure 5:
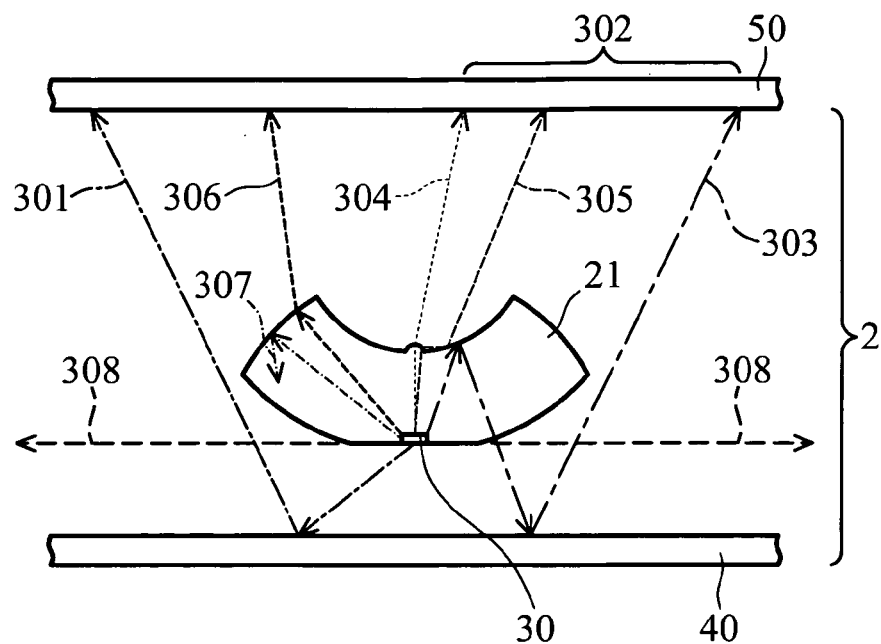
FIG. 5 shows a cross-section along line A—A of FIG. 4.

Referring to FIGS. 4 and 5, the backlight module 2 comprises a reflective sheet 40, at least one point light unit 20, and a dish lens 21. The point light unit 30 is located above the reflective sheet 40. The dish lens 21 is located above the point light unit 30. The dish lens 21 comprises the light-reflecting surface 212, the light-permeable surface 211, the smooth curve surfaces 213, and the light-scattering surface 214. The light-permeable surface 211 is concave. The light-reflecting surface 212, located on the light-permeable surface 211, is a reflective coated layer, forming the front reflective layer 215 and the back reflective layer 216. The light-reflecting surface 212 is concave. The smooth curve surfaces 213 are translucent and connect the light-reflecting surface 212 and the light-permeable surface 211 at an inclined angle. The light-scattering surface 214 is convex and formed on the central axis of the light-reflecting surface 212. The light-permeable surface 212 comprises the space 217 located in the center of the light-permeable surface 211 and receives point light unit 30. A diffuser 50 is disposed above the dish lens 21.

The point light unit 30 generates a rear light beam 301, a front light beam 302, and a horizontal light beam 308. The rear light beam 301 is emitted to the reflective sheet 40 and reflected by the reflective sheet 40 to the diffuser 50.

The front light beam 302 is emitted to the dish lens 21 and comprises a reflective light beam 303, a directly diffusing light beam 304, and an indirectly diffusing light beam 305. The reflective light beam 303 is emitted from the point light unit 30 through the back reflective layer 216 and reflected to the reflective sheet 40 and the diffuser 50 by the reflective sheet 40. The directly diffusing light beam 304 is emitted from the point light unit 30 through the dish lens 21, and scattered to the diffuser 50 by the light-scattering surface 214. The indirectly diffusing light beam 305 is emitted by the point light unit 30 through the dish lens 21, and scattered to the front reflective layer 215 by the light-scattering surface 214 and the diffuser 50 by the front reflective layer 215 of the light-reflecting surface 212.

The smooth curve surfaces 213 are translucent. Light emitted by the point light unit 30 travels in different paths, wherein a first side light beam 306 is emitted from point light unit 30 through the smooth curve surfaces 213 of the dish lens 21 to the diffuser 50, a second side light beam 307 fails to pass through the smooth curve surfaces 213 and returning to the dish lens 21 and a horizontal light beam 308 is emitted from the point light unit 30 to sides of the dish lens 21 horizontally.

Figure 6:
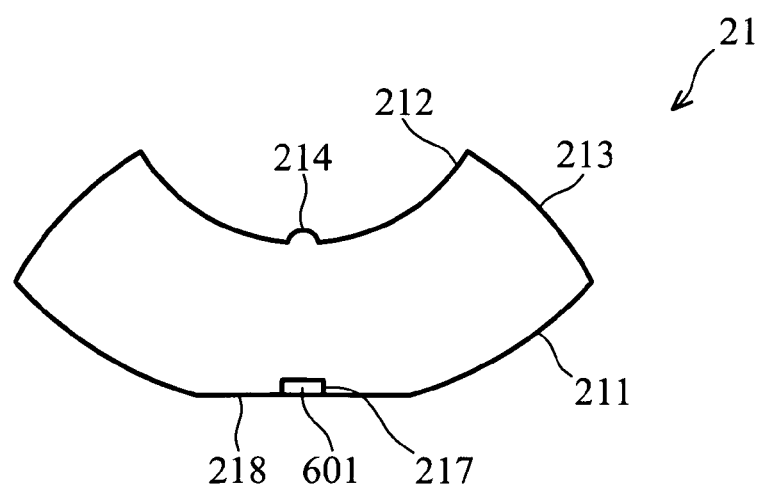
FIG. 6 is a schematic diagram of light beams of a backlight module of the present invention.

Referring to FIG. 6, a light emitting diode assembly comprises a light emitting semiconductor device and the dish lens 21. The light emitting semiconductor device is received in the dish lens 21.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A backlight module, comprising:
    a reflective sheet;
    at least one point light unit located over the reflective sheet; and
    at least one dish lens for wrapping the point light unit, including:
        a light-permeable surface forming the bottom of the dish lens, the cross-section of the light-permeable surface having a substantially concave shape;
        a light-reflecting surface forming the top of the dish lens, the cross-section of the light-reflecting surface having a substantially concave shape;
        two smooth curve surfaces forming two sides of the dish lens for connecting the light-reflecting surface and the light-permeable surface; and
        a light-scattering surface located on the central axis of the light-reflecting surface, the cross-section of the light-scattering surface having a substantially convex shape.

2. The backlight module of claim 1, wherein the light-reflecting surface of the dish lens has a reflective layer adapted for forming a front reflective layer and a back reflective layer.

3. The backlight module of claim 1, wherein the two smooth curve surfaces are substantially translucent.

4. The backlight module of claim 1, wherein the light-permeable surface of the dish lens has a predetermined space for wrapping the point light unit.

5. The backlight module of claim 1, wherein the point light unit is configured to generate a rear light beam emitted to the reflective sheet and reflected by the reflective sheet.

6. The backlight module of claim 1, wherein the point light unit is configured to generate a front light beam emitted to the dish lens.

7. The backlight module of claim 6, further comprising a diffuser disposed over the dish lens.

8. The backlight module of claim 7, wherein the reflective light beam is emitted from the point light unit through the back reflective layer of the dish lens, and reflected to the reflective sheet, and reflected to the diffuser.

9. The backlight module of claim 7, wherein the directly diffusing light beam is emitted from the point light unit through the dish lens, and scattered to the diffuser by the light-scattering surface.

10. The backlight module of claim 7, wherein the indirect diffusing light beam is emitted by the point light unit through the dish lens and scattered to the diffuser by the light-reflecting surface.

11. The backlight module of claim 1, wherein the point light unit comprises a light emitting diode (LED).

12. A dish lens, comprising:
    a light-permeable surface forming the bottom of the dish lens, the cross-sectional of the light-permeable surface having a substantially concave shape;
    a light-reflecting surface forming the top of the dish lens, the cross-sectional of the light-reflecting surface having a substantially concave shape;
    two smooth curve surfaces forming two sides of the dish lens for connecting the light-reflecting surface and the light-permeable surface; and
    a light-scattering surface located on the central axis of the light-reflecting surface, the cross-section of the light-scattering surface having a substantially convex shape.

13. The dish lens as claimed in claim 12, wherein the light-permeable surface has a predetermined space located in the center of the light-permeable surface.

14. A light emitting diode, comprising:
    a light emitting semiconductor device; and
    a dish lens comprising:
        a light-permeable surface forming the bottom of the dish lens, the cross-section of the light-permeable surface having a substantially concave shape;
        a light-reflecting surface forming the top of the dish lens, the cross-section of the light-reflecting having a substantially concave shape;
        two smooth curve surfaces forming two sides of the dish lens for connecting the light-reflecting surface and the light-permeable surface; and
        a light-scattering surface located on the central axis of the light-reflecting surface, the cross-section of the light-scattering surface having a substantially convex shape.

15. The light emitting diode of claim 14, wherein the light-permeable surface has a predetermined space for receiving the light emitting semiconductor device.

* * * * *